(12) United States Patent
Korvenheimo et al.

(10) Patent No.: US 6,222,730 B1
(45) Date of Patent: Apr. 24, 2001

(54) METHOD AND AN ARRANGEMENT FOR COOLING AN APPARATUS CABINET

(75) Inventors: Petteri Korvenheimo; Eero Riekki, both of Oulu (FI)

(73) Assignee: Nokia Telecommunications Oy, Espoo (FI)

( * ) Notice: Subject to any disclaimer, the term of this patent is extended or adjusted under 35 U.S.C. 154(b) by 0 days.

(21) Appl. No.: 09/091,919
(22) PCT Filed: Dec. 20, 1996
(86) PCT No.: PCT/FI96/00692
 § 371 Date: Jun. 25, 1998
 § 102(e) Date: Jun. 25, 1998
(87) PCT Pub. No.: WO97/24911
 PCT Pub. Date: Jul. 10, 1997

(30) Foreign Application Priority Data

Dec. 29, 1995 (FI) .................................................. 956361

(51) Int. Cl.⁷ ........................................................ H05K 7/20
(52) U.S. Cl. ...................................... 361/696; 454/184
(58) Field of Search ........................... 62/259.2; 361/688, 361/690, 694–696, 724; 454/184

(56) References Cited

U.S. PATENT DOCUMENTS

| 4,386,651 | 6/1983 | Reinhard . |
| 4,644,443 | 2/1987 | Swensen et al. . |
| 5,027,254 | 6/1991 | Corfits et al. . |
| 5,410,448 | 4/1995 | Barker, III et al. . |
| 5,467,250 | 11/1995 | Howard et al. . |
| 5,681,219 | * 10/1997 | LeFevre et al. ...................... 454/187 |

FOREIGN PATENT DOCUMENTS

| 2 277 767 | 11/1994 | (GB) . |
| 0439081 | * 1/1975 | (SU) ..................................... 361/690 |

OTHER PUBLICATIONS

Patent Abstracts of Japan, vol. 17,No. 676,E–1475,abstract of JP,A,5–226864, Sep. 3, 1993.

* cited by examiner

Primary Examiner—Gregory Thompson
(74) Attorney, Agent, or Firm—Pillsbury Winthrop LLP

(57) ABSTRACT

A method and arrangement for cooling an apparatus cabinet by: causing air to flow into a cooling arrangement that is connected to the cabinet to remove heat from the cabinet and to produce an exhaust flow of air that is heated by the heat removed from the cabinet; and reducing noise produced by the exhaust flow by conveying the exhaust flow to a space outside of the cabinet through a separate mounting base disposed beneath the cabinet.

25 Claims, 1 Drawing Sheet

METHOD AND AN ARRANGEMENT FOR COOLING AN APPARATUS CABINET

Figure 1:
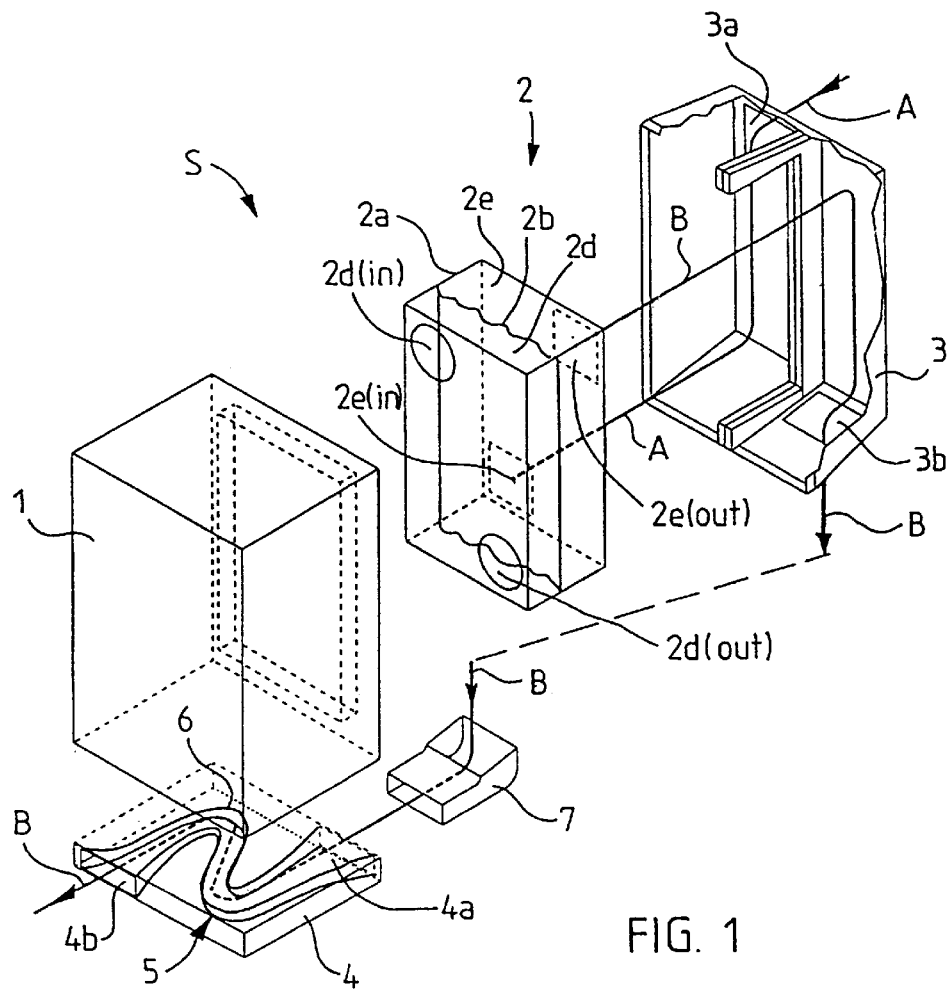

This application is the national phase of international application PCT/FI96/00692, filed Dec. 20, 1996 which designated the U.S.

The invention relates to a cooling arrangement for cooling an apparatus cabinet, comprising means for conveying heated air out as an exhaust air flow for cooling the apparatus cabinet.

The invention also relates to a method for cooling an apparatus cabinet, in which method air is drawn into a cooling arrangement provided in connection with the apparatus cabinet and heated air is conveyed out from the cooling arrangement as an exhaust air flow.

The present solution relates to the cooling of apparatus cabinets, particularly base station cabinets, and to reducing the noise created by the exhaust air flow in the cooling.

The electronic components of the base station naturally produce heat that must be evacuated from the apparatus cabinet by means of an exhaust air flow. A heat exchanger or an air conditioning unit comprising a fan can be used to remove the heat. The exhaust air flow made up by warm air produces a sound, i.e. noise problems. Previously the base stations of cellular radio networks were large in size, and they were located in spots or spaces where there was no people present or passing by. With advances in the state of the art of cellular radio networks and apparatus technology, new very small base stations have entered the market, and such base stations may be located for instance on a street or in office rooms, for example, and therefore noise reduction of the exhaust air flow is a factor assuming an ever increasing importance.

To reduce the noise of the exhaust air flow, a 'noise trap' is known which is a tubular part outside the apparatus cabinet at the side of the cabinet, through which the exhaust air flow is brought out. Such solutions do not have a sufficient noise abating effect, and furthermore have the special disadvantage that they add to the outer dimensions of the base station, and hence the mounting of the base station requires more space and the outer appearance of base stations is impaired. With the prior solutions, it has not been possible to reduce the noise to be low enough.

The publications U.S. Pat. No. 4,386,651 and U.S. Pat. No. 5,467,250 disclose a conventional cooling arrangement for an apparatus cabinet, provided with an internal circulation and an external circulation. Reference publication GB 227-7767 discloses a conventional cooling arrangement for an apparatus cabinet for a base station.

The publication JP 5-226864 discloses a normal noise trap construction comprising an absorbent material in an exhaust duct in an apparatus cabinet.

The publication U.S. Pat. No. 4,644,443 discloses a normal cooling arrangement in electronics, wherein the exhaust air is discharged from the lower portion of the cabinet. The exhaust air flow is not separately conveyed in any given direction, and no actual noise trap construction is utilized, except as an absorption mat installed on the floor of the cabinet. A specific problem in said solution is that in the solution the lower portion of the apparatus cabinet forms a single unit with the actual apparatus cabinet. Thus, the apparatus cabinet and its lower portion are always dependent on one another.

It is an object of the present invention to provide a novel cooling arrangement avoiding the problems related with the prior art solutions.

This object is achieved with a cooling arrangement in accordance with the invention, which is characterized in that to reduce the noise of the exhaust air flow, the means for conveying heated air out are in communication with a separate mounting base disposed beneath the apparatus cabinet, and forming par of the cooling arrangement, for conveying heated air out through an exhaust duct in said separate mounting base beneath the apparatus cabinet.

This object is achieved with a method in accordance with the invention, which is characterized in that the exhaust air flow is conveyed out through a separate mounting base beneath the apparatus cabinet.

The cooling arrangement and method in accordance with the invention are based on the idea that a separate mounting base beneath the apparatus cabinet is utilized in reducing the noise of the exhaust air flow.

The solution in accordance with the invention affords several advantages. By means of the mounting base, the length of the blow duct of the outer circulation of the cooling apparatus can be increased by up to one meter without the outer dimensions of the base station and the cooling apparatus being changed. This increase in the length of the duct achieves a considerable reduction of the noise level, as much as 3–5 dB. When the exhaust air is conveyed out for example from the front edge of the mounting base, the further advantage is achieved that the outlet for exhaust air and the inlet for cooling air are on different sides of the cabinet, and hence the hot exhaust air flow, i.e. blowing air, cannot circulate to the inlet for cold air, i.e. to the suction side. Since the exhaust air duct is in a separate mounting base, i.e. not in the same unit as the actual apparatus cabinet, this allows many different combinations of different mounting bases and different apparatus cabinets to be made. For example, several kinds of bases can be manufactured, and a base suitable for the particular application can be selected when the base station apparatus entity is assembled. Correspondingly, an apparatus cabinet suitable for each particular application can be selected for the base, since the apparatus cabinet and mounting base do not form a single unit.

Figure 2:
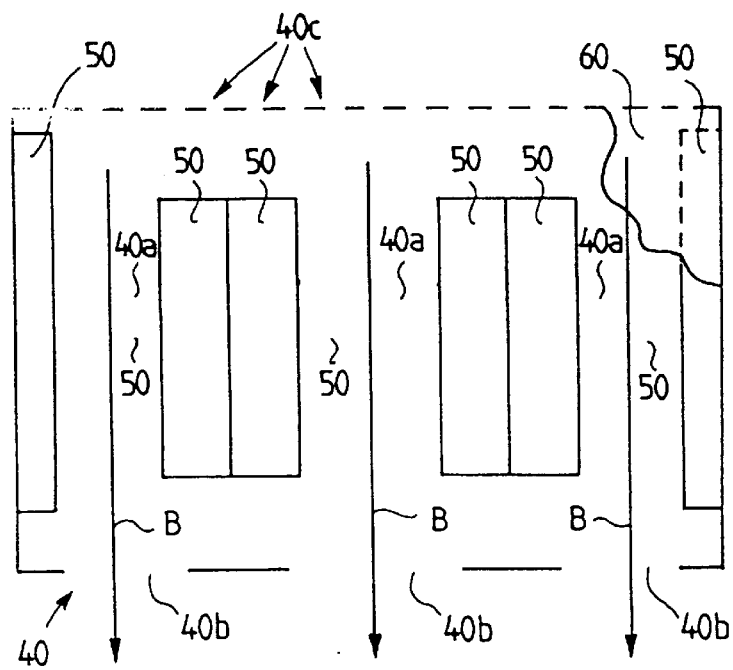

The invention will be described in the following with reference to the accompanying drawings, in which FIG. 1 is an exploded view showing structural parts of a base station cabinet, FIG. 2 shows a second preferred embodiment of a mounting base for an apparatus cabinet in a top view.

FIG. 1 shows a cooling arrangement entity S for cooling an apparatus cabinet 1 to be cooled and means 2 installed in an opening at the rear of cabinet 1 for conveying heated air out as an exhaust air flow B for cooling the apparatus cabinet. In a preferred embodiment, the apparatus cabinet 1 is an apparatus cabinet of a base station of a cellular radio network. In a preferred embodiment of the invention, said means 2 for conveying heated air out comprise a heat exchanger 2*a* with a divider element 2*b*, an interior air circulation duct 2*d* and an exterior air circulation duct 2*e*, said interior air circulation duct 2*d* and said exterior air circulation duct 2*e* being divided by the divider element 2*b*. The interior air circulation duct 2*d* of the heat exchanger comprises an air inlet 2*d* (IN) and an air outlet 2*d* (OUT). The exterior air circulation duct 2*e* of the heat exchanger again comprises an air inlet 2*e*(IN) and an air outlet 2*e*(OUT). The heat exchanger 2*a* also incorporates guide means 3, i.e. a guide cover 3, directing the cold incoming air through an opening 3*a* downwardly towards the inlet 2*e*(IN) of the exterior air circulation duct 2*e* of the heat exchanger. Furthermore, the guide cover 3 directs the heated air emerging through the outlet 2*e*(OUT) of the exterior circulation duct 2*e* of the heat exchanger, from the upper portion of the heat exchanger, downwardly towards an opening 3b in the bottom of guide cover 3. Heating of the air in the exterior air circulation duct 2e is a result of the fact that the warmer air in the interior air circulation duct 2d on the other side of the divider element 2b in the heat exchanger gives up heat to the other side of the divider element 2b of the heat exchanger, i.e. to the exterior air circulation duct 2e.

In accordance with the invention, the means 2 for conveying heated air out are in communication with an exhaust duct 4a in the separate mounting base 4 beneath the apparatus cabinet for conveying heated air out through said exhaust duct 4a. When a heat exchanger is involved, the solution is such that the exhaust duct 4a in the separate mounting base 4 beneath the apparatus cabinet is in communication with the outlet 2e(OUT) of the exterior air circulation duct of the heat exchanger.

At its simplest, the exhaust duct 4a is formed by the interior of the mounting base 4, but preferably, for example, is a narrow duct 4a in which the exhaust air flow can be turned.

In a preferred embodiment, the cooling arrangement is such that the exhaust duct in the mounting base includes one or more turning points 5–6 at which the direction of the exhaust air flow is turned. In a preferred embodiment, the cooling arrangement is such that the exhaust duct 4a in the mounting base 4 comprises at least two turning points, i.e. turning points 5 and 6, and that the turning points 5 and 6 are directed so as to turn the exhaust air flow in different directions. In FIG. 1, turning point 5 is adapted to turn the 20 exhaust air flow clockwise and turning point 6 is adapted to turn the exhaust air flow counter-clockwise. Said preferred embodiments abate the noise of the exhaust air flow to a still lower level.

In a preferred embodiment of the invention, the solution is such that the outlet opening 4b at the end of the exhaust duct is on a different side, i.e. preferably on the opposite side, from the opening 3a for cooling air of the cooling arrangement. The opening 4b at the end of the exhaust duct 4a is preferably on the front side of the apparatus cabinet. In a preferred embodiment, the exhaust duct 4a of the base 4 is thus in the lower portion of the cooling arrangement, whereas the opening 3a for cooling air is in the upper portion of the cooling arrangement. In that situation, the cooling air is thus introduced into the upper portion of the cooling arrangement and the exhaust air flow B is discharged from the lower portion of the cooling arrangement. On account of these preferred embodiments, the hot exhaust air flow, i.e. blowing air, cannot circulate to the inlet for cold air to opening 3a, i.e. to the suction side.

Seen as a cooling method, a method is involved for cooling apparatus cabinet 1, in which method air flow A is taken in into cooling arrangement 2 provided in connection with the apparatus cabinet 1, and heated air is discharged from the cooling arrangement as an exhaust air flow B. In accordance with the invention, the exhaust air flow B is conveyed out through the mounting base of the apparatus cabinet. In a preferred embodiment of the invention, the method is such that the direction of the exhaust air flow B is turned in the exhaust duct 4a in the mounting base 4 at its turning points 5–6. The exhaust air flow B is preferably turned in at least two different directions in the mounting base 4.

In a preferred embodiment of the method, the exhaust air flow B is conveyed out on a different side of the apparatus cabinet, i.e. preferably on the opposite side, through opening 4b, from the side to which the cooling air flow A is brought in. The cold cooling air flow A is thus brought to the rear, up into opening 3a and it exits as a warm exhaust air flow B from the front, down through duct 4a after having passed through the exterior circulation duct 2e of the heat exchanger and through the exhaust duct 4a in the mounting base.

In a preferred embodiment of the invention, the cooling arrangement comprises an interconnecting piece 7, and in such a case the exhaust air flow B is conveyed through interconnecting piece 7 to the mounting base 4. In a preferred embodiment, the direction of the exhaust air flow is changed already in the interconnecting piece 7. In the example of FIG. 1, the exhaust air flow B is turned from vertical to horizontal and thus at the same time shifts the exhaust air flow to the mounting base 4, to the exhaust duct 4a thereof.

A heat exchanger 2a–e, 3 is preferably employed in the cooling method on account of its simplicity and efficiency. In such a case, the exhaust air flow B is conveyed to the mounting base 4 from the outlet 2e(IN) of the exterior air circulation duct 2e of the heat exchanger, preferably from the lower portion of the heat exchanger.

In another embodiment, no heat exchanger is used but in such a case the means 2 for conveying heated air out comprise an air-conditioning unit including a fan (not shown). In that case, the exhaust duct in the mounting base of the apparatus cabinet is in communication with the outlet in the air-conditioning unit.

FIG. 2 shows a second preferred embodiment of a mounting base for an apparatus cabinet, shown from the inside. In FIG. 2, the mounting base is denoted by reference numeral 40. In a preferred embodiment of the invention, the mounting base includes an absorbent material 50 improving the efficiency of noise reduction and shaping the flow. Absorbent material 50 is provided preferably in the form of elongated bars having the direction of the flow and as also on the bottom of the mounting base. In a preferred embodiment, the solution is such that the absorbent material 50 within the mounting base 40 and/or the side, bottom or top walls 60 of the mounting base 50 define one or more exhaust ducts 40a for the exhaust air flow B in the mounting base 40. With such a solution, in the Applicant's observation the desired noise abatement is achieved with a simple construction without the flow being prevented too much. In FIG. 2, the exhaust air flow B is brought to the mounting base through one or more openings 40c and exits through one or more openings 40b.

Even though the invention has been described above with reference to examples in accordance with the accompanying drawings, it is obvious that the invention is not restricted thereto, but it can be modified in many ways within the scope of the inventive idea set forth in the appended claims.

What is claimed is:

1. A cooling arrangement for cooling an apparatus cabinet having a front, said arrangement comprising:

means disposed for conveying heated air away from the cabinet as an exhaust air flow for cooling the cabinet, and noise reduction means comprising a separate mounting base adapted to be disposed beneath the cabinet, said mounting base having an exhaust air duct in communication with said means for conveying in order to convey the exhaust air flow to an open air space outside of the cabinet, said exhaust air duct being formed to define a horizontal flow path which is curved to subject heated air to at least two reversals in direction and having an outlet end located at the front of the cabinet when the cabinet is mounted on the mounting base.

2. A cooling arrangement as claimed in claim 1, wherein the cooling arrangement has two opposed sides and an inlet (3a) at one of the opposed sides for supplying cooling air to said means for conveying heated air, and further wherein said exhaust air duct (4a) has at least one exhaust opening (4b) located at the other one of the opposed sides.

3. A cooling arrangement as claimed in claim 2, wherein the cooling arrangement has an upper portion at which the inlet (3a) is located and a lower portion at which the at least one exhaust openings (4b) is located.

4. A cooling arrangement as claimed in claim 1, wherein the apparatus cabinet has a front and said exhaust air duct (4a) has at least one exhaust opening (4b) located beneath the front of the apparatus cabinet.

5. A cooling arrangement for cooling an apparatus cabinet, said arrangement comprising:
  means disposed for conveying heated air away from the cabinet as an exhaust air flow for cooling the cabinet, and
  noise reduction means comprising a separate mounting base adapted to be disposed beneath the cabinet, said mounting base having an exhaust air duct in communication with said means for conveying in order to convey the exhaust air flow to an open air space outside of the cabinet, further comprising an interconnecting piece (7), and wherein the means (2) for conveying heated air (B) are in communication through said interconnecting piece (7) with the exhaust air duct (4a).

6. A cooling arrangement for cooling an apparatus cabinet, said arrangement comprising:
  means disposed for conveying heated air away from the cabinet as an exhaust air flow for cooling the cabinet, and
  noise reduction means comprising a separate mounting base adapted to be disposed beneath the cabinet, said mounting base having an exhaust air duct in communication with said means for conveying in order to convey the exhaust air flow to an open air space outside of the cabinet, wherein;
  the apparatus cabinet has an interior;
  the means (2) for conveying heated air comprise a heat exchanger (2a, 3) with a divider element (2b), and an interior air circulation duct (2d) and an exterior air circulation duct (2e) divided by the divider element (2b), the interior air circulation duct (2d) comprising an air inlet (2d(IN)) and an air outlet (2d(OUT)), both the air inlet and the air outlet of the interior air circulation duct being in communication with the interior of the apparatus cabinet, and the exterior air circulation duct (2e) comprising an air inlet (2e(IN)) and an air outlet (2e(OUT); and
  the exhaust air duct (4a) in the mounting base (4) is in communication with the outlet (2e(OUT)) of the exterior air circulation duct (2e) of the heat exchanger (2a, 3).

7. A cooling arrangement for cooling an apparatus cabinet, said arrangement comprising:
  means disposed for conveying heated air away from the cabinet as an exhaust air flow for cooling the cabinet, and
  noise reduction means comprising a separate mounting base adapted to be disposed beneath the cabinet, said mounting base having an exhaust air duct in communication with said means for conveying in order to convey the exhaust air flow to an open air space outside of the cabinet, wherein the means (2) for conveying heated air out comprise an air-conditioning unit including a fan, and that the exhaust air duct (4a) in the mounting base (4) of the apparatus cabinet is in communication with the outlet in the air conditioning unit.

8. A cooling arrangement as claimed in claim 1, wherein the apparatus cabinet (1) is an apparatus cabinet (1) of a base station of a cellular radio network or other radio network.

9. A cooling arrangement as claimed in claim 1, wherein the exhaust air duct (4a) in the separate mounting base (4) beneath the apparatus cabinet contains an absorbent material (50).

10. A cooling arrangement as claimed in claim 9, wherein the absorbent material (50) defines the exhaust air duct (40a).

11. A cooling arrangement as claimed in claim 1, wherein said exhaust air duct (4a) has an outlet end provided with at least one exhaust opening (4b) for conveying the exhaust air flow out of said cooling arrangement and away from the apparatus cabinet.

12. A cooling arrangement as claimed in claim 1 wherein the open air space is at atmospheric pressure.

13. A cooling arrangement as claimed in claim 1 wherein the apparatus cabinet has an interior which encloses an air space and said means for conveying heated air include an element (2) adapted to separate the air space in the cabinet from the exhaust air flow.

14. A cooling arrangement as claimed in claim 1 wherein said exhaust air duct defines a horizontal air flow path having at least one turning point.

15. A method for cooling an apparatus cabinet, said method comprising:
  causing air to flow into a cooling arrangement that is connected to the cabinet to remove heat from the cabinet and to produce an exhaust flow of air that is heated by the heat removed from the cabinet; and
  reducing noise produced by the exhaust flow by conveying the exhaust flow to an open space outside of the cabinet through a separate mounting base disposed beneath the cabinet said step of conveying being performed by conveying the exhaust flow alone a horizontal flow path which is curved to subject heated air to at least two reversals in direction and causing the exhaust flow to exit the mounting base via an outlet end located at the front of the cabinet.

16. A method as claimed in claim 15, wherein the exhaust air flow (B) is conveyed out through an exhaust air duct (4a) in the separate mounting base (4) beneath the apparatus cabinet (1).

17. A method as claimed in claim 15, wherein cooling air is conveyed into the cooling arangement at an inlet side and the exhaust air flow (B) is conveyed out on a different side from the inlet side for the cooling air (A).

18. A method as claimed in claim 15, wherein the cooling air flows into a first side of the cooling arrangement and the exhaust air flow occur at a second side of the cooling arrangement, the second side being different from the first side.

19. A method as claimed in claim 15, wherein the cooling air flows into a first side of the cooling arrangement and the exhaust air flow occur at a second side of the cooling arrangement, the second side being opposite to the first side.

20. A method as claimed in claim 15, wherein the cooling arrangement has an upper portion and a lower portion, the cooling air flows into the upper portion and the exhaust air flow occurs at the lower portion.

21. A method for cooling an apparatus cabinet, said method comprising:
   causing air to flow into a cooling arrangement that is connected to the cabinet to remove heat from the cabinet and to produce an exhaust flow of air that is heated by the heat removed from the cabinet; and
   reducing noise produced by the exhaust flow by conveying the exhaust flow to an open space outside of the cabinet through a separate mounting base disposed beneath the cabinet, wherein the exhaust air flow (B) is conveyed by means of an interconnecting piece (7) to the mounting base (4).

22. A method as claimed in claim 21, wherein the direction of the exhaust air flow (B) is changed in the interconnecting piece (7).

23. A method for cooling an apparatus cabinet, said method comprising:
   causing air to flow into a cooling arrangement that is connected to the cabinet to remove heat from the cabinet and to produce an exhaust flow of air that is heated by the heat removed from the cabinet; and
   reducing noise produced by the exhaust flow by conveying the exhaust flow to an open space outside of the cabinet through a separate mounting base disposed beneath the cabinet, wherein:
   the apparatus cabinet has an interior;
   the cooling arrangement includes a heat exchanger (2a, 3) with a divider element (2b), and an interior air circulation duct (2d) and an exterior air circulation duct (2e) divided by the divider element (2b), the interior air circulation duct (2d) comprising an air inlet (2d(IN)) and an air outlet (2d(OUT)), both the air inlet and the air outlet of the interior air circulation duct being in communication with the interior of the apparatus cabinet, and the exterior air circulation duct (2e) comprising an air inlet (2e(IN)) and an air outlet (2e(OUT)); and
   the exhaust air duct (4a) in the mounting base (4) is in communication with the outlet (2e(OUT)) of the exterior air circulation duct (2e) of the heat exchanger (2a, 3).

24. A method as claimed in claim 23, wherein the outlet (2e(OUT)) of the exterior air circulation duct (2e) is in a lower portion of the heat exchanger (2a, 3).

25. A method as claimed in claim 15, wherein the mounting base has an exhaust air duct (4a) through which the exhaust air flow is conveyed and the exhaust air duct (4a) has an outlet end provided with at least one exhaust opening (4b) for conveying the exhaust air flow out of said cooling arrangement and away from the apparatus cabinet.

* * * * *